US012689003B2

(12) United States Patent
Park et al.

(10) Patent No.: US 12,689,003 B2
(45) Date of Patent: Jul. 21, 2026

(54) FILM DEPOSITION APPARATUS

(71) Applicant: Tokyo Electron Limited, Tokyo (JP)

(72) Inventors: Taehoon Park, Gyeonggi-do (KR);
Jaihyung Won, Gyeonggi-do (KR);
Naeil Lee, Gyeonggi-do (KR);
Jinhyung Park, Gyeonggi-do (KR);
Choonkum Baik, Gyeonggi-do (KR);
Hyonam Lim, Gyeonggi-do (KR)

(73) Assignee: Tokyo Electron Limited, Tokyo (JP)

( * ) Notice: Subject to any disclaimer, the term of this patent is extended or adjusted under 35 U.S.C. 154(b) by 466 days.

(21) Appl. No.: 18/486,288

(22) Filed: Oct. 13, 2023

(65) Prior Publication Data

US 2024/0038498 A1     Feb. 1, 2024

Related U.S. Application Data

(63) Continuation of application No. PCT/JP2021/016854, filed on Apr. 27, 2021.

(51) Int. Cl.
*H01J 37/32* (2006.01)
*C23C 16/455* (2006.01)
*C23C 16/507* (2006.01)
*C23C 16/52* (2006.01)
(52) U.S. Cl.
CPC .. *H01J 37/32183* (2013.01); *C23C 16/45565* (2013.01); *C23C 16/4557* (2013.01); *C23C 16/507* (2013.01); *C23C 16/52* (2013.01); *H01J 37/32091* (2013.01); *H01J 37/321* (2013.01); *H01J 37/3244* (2013.01); *H01J 37/32568* (2013.01); *H01J 2237/332* (2013.01)

(58) Field of Classification Search
None
See application file for complete search history.

(56) References Cited

U.S. PATENT DOCUMENTS

2010/0193128 A1   8/2010  Koumura et al.
2021/0222296 A1   7/2021  Yamawaku

FOREIGN PATENT DOCUMENTS

JP            4819244    11/2011
JP         2016-145385    8/2016
KR    10-2021-0006985     1/2021

*Primary Examiner* — Christopher T Schatz
(74) *Attorney, Agent, or Firm* — IPUSA, PLLC

(57) ABSTRACT

A film deposition apparatus includes a reactive gas supply configured to supply a reactive gas to a first chamber; a source gas supply configured to supply a source gas to a second chamber; a first plasma mechanism configured to generate inductively coupled plasma for activating the reactive gas; a second plasma mechanism configured to generate capacitively coupled plasma for activating the reactive gas activated by the first plasma mechanism and the source gas; and a controller. The second plasma mechanism includes an upper electrode; a lower electrode opposite to the upper electrode; a first high-frequency power supply configured to apply a high-frequency power to the upper electrode via a first matcher; a second high-frequency power supply configured to apply a high-frequency power to the upper electrode via a second matcher; and a third matcher connected to the lower electrode. The third matcher includes a variable capacitor.

6 Claims, 4 Drawing Sheets

FILM DEPOSITION APPARATUS

CROSS-REFERENCE TO RELATED APPLICATIONS

This application is a continuation application of International Application No. PCT/JP2021/016854 filed on Apr. 27, 2021, and designating the U.S., the entire contents of which are incorporated herein by reference.

BACKGROUND

1. Technical Field

The present disclosure relates to a film deposition apparatus.

2. Description of the Related Art

Patent Document 1 discloses a plasma processing apparatus including a lower electrode disposed in an airtight processing chamber and having a mounting surface on which an object to be processed is mounted, an upper electrode disposed in the processing chamber and facing the mounting surface of the lower electrode, a high-frequency power supply configured to generate an alternating electric field in the processing chamber to excite plasma, a matching circuit provided between the upper electrode and the high-frequency power supply, a first filter connected between the lower electrode and ground and having a variable circuit characteristic, a sensor configured to detect a state of the plasma, and a control unit configured to control the circuit characteristic of the first filter based on a detection result output from the sensor, for example.

RELATED ART DOCUMENT

Patent Document

[Patent Document 1] Japanese Patent No. 4819244

SUMMARY

According to one embodiment of the present disclosure, a film deposition apparatus includes a reactive gas supply configured to supply a reactive gas to a first chamber; a source gas supply configured to supply a source gas to a second chamber; a first plasma mechanism configured to generate inductively coupled plasma for activating the reactive gas; a second plasma mechanism configured to generate capacitively coupled plasma for activating the reactive gas activated by the first plasma mechanism and the source gas; and a controller. The second plasma mechanism includes an upper electrode; a lower electrode opposite to the upper electrode; a first high-frequency power supply configured to apply a high-frequency power to the upper electrode via a first matcher; a second high-frequency power supply configured to apply a high-frequency power to the upper electrode via a second matcher; and a third matcher connected to the lower electrode. The third matcher includes a variable capacitor.

DETAILED DESCRIPTION

Figure 1:
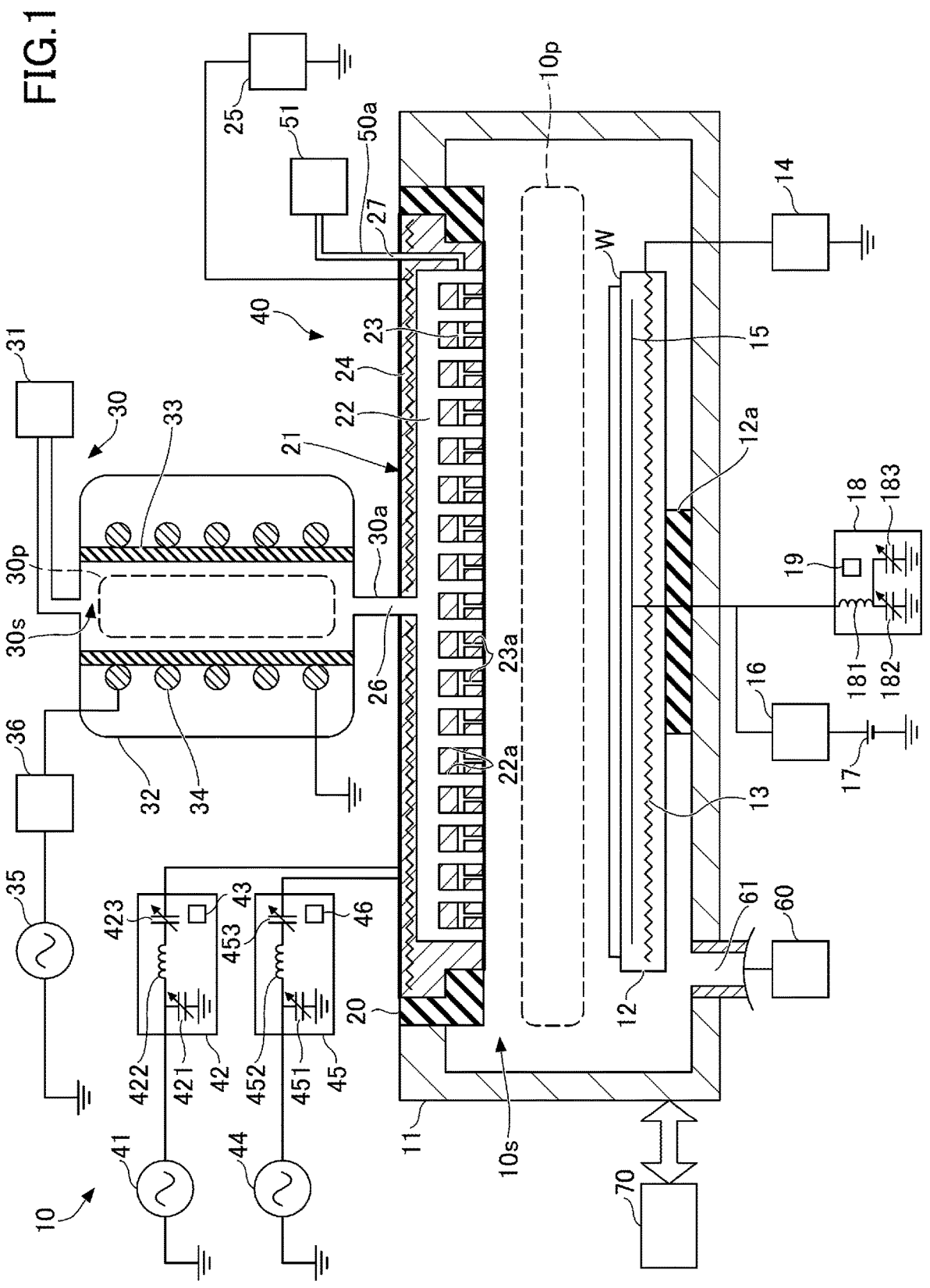
FIG. 1 is a schematic cross-sectional view illustrating a film deposition apparatus according to a first embodiment.

In the following, embodiments of the present disclosure will be described with reference to the drawings. In the drawings, the same components are denoted by the same reference symbols, and duplicated description may be omitted.

First Embodiment

A film deposition apparatus 10 according to a first embodiment will be described with reference to FIG. 1. FIG. 1 is a schematic cross-sectional view illustrating the film deposition apparatus 10 according to the first embodiment.

The film deposition apparatus 10 includes a substantially cylindrical processing chamber 11 and a substrate W is accommodated inside the processing chamber 11 (hereinafter, also referred to as a "second chamber 10s"). The processing chamber 11 is grounded. An exhaust path 61 is provided at the bottom of the processing chamber 11, and a gas inside the processing chamber 11 is exhausted by an exhaust device 60 connected to the exhaust path 61.

A stage 12 on which the substrate W is mounted is disposed inside the processing chamber 11. The stage 12 is made of insulating ceramics such as AlN. The stage 12 is supported by a support member 12a made of insulating ceramics and extending vertically from the bottom of the processing chamber 11. A heater 13 made of high-melting-point metal such as molybdenum is embedded in the stage 12. The heater 13 heats the substrate W on the stage 12 to a predetermined temperature (for example, about 400° C. to about 600° C.) by being supplied with electric power from the heater power supply 14. Here, the stage 12 may be an electrical conductor. Multiple raising/lowering pins are inserted into the stage 12 so as to protrude from and retract into the upper surface of the stage 12 by a raising/lowering mechanism, and the substrate W is transferred onto the stage 12 by the raising/lowering operation of the multiple raising/lowering pins.

An electrode 15 formed in a film shape is embedded in the stage 12. The electrode 15 is connected to a direct current (DC) power supply 17 via a filter 16. When a DC voltage is applied from the DC power supply 17 to the electrode 15, an electrostatic attractive force is generated between the electrode 15 and the substrate W. The substrate W is held on the stage 12 by the electrostatic attractive force.

Additionally, the electrode 15 is grounded via a matcher (a third matcher) 18. The matcher 18 includes a coil 181, a variable capacitor 182, and a variable capacitor 183. The variable capacitor 182 and the variable capacitor 183 are arranged in parallel. The coil 181 is arranged in series with respect to the variable capacitors 182 and 183. The matcher 18 is provided with a high-frequency sensor (a third high-frequency sensor) 19 that detects a current (a high-frequency current) flowing through the matcher 18, a voltage (a high-frequency voltage) applied to the matcher 18, and a self-bias voltage (Vdc) of the electrode 15. A controller 70 controls the variable capacitors 182 and 183 of the matcher 18 based on the detection result of the high-frequency sensor 19.

A showerhead 21 is fitted into a ceiling wall of the processing chamber 11 via an insulating member 20. The showerhead 21 has a substantially disk shape and is made of a conductive material. A first gas supply path 22 and a second gas supply path 23 are formed inside the showerhead 21. The first gas supply path 22 and the second gas supply path 23 are gas paths of different systems. The first gas supply path 22 communicates with multiple first gas holes 22a, and the second gas supply path 23 communicates with multiple second gas holes 23a.

A heater (a second heater) 24 made of high-melting-point metal such as molybdenum is embedded in the showerhead 21. The heater 24 heats the showerhead 21 to a predetermined temperature (e.g., about 150° C. to about 350° C.) by being supplied with power from a heater power supply 25, thereby heating the gas flowing through the first gas supply path 22 formed in the showerhead 21. Additionally, the gas flowing through the second gas supply path 23 formed in the showerhead 21 is heated.

The film deposition apparatus 10 includes a first plasma mechanism 30, a second plasma mechanism 40, a reactive gas supply 31, a source gas supply 51, and the controller 70. The first plasma mechanism 30 generates inductively coupled plasma (ICP) inside an external chamber 32 (hereinafter, also referred to as a "first chamber 30s") installed outside the processing chamber 11 in which the substrate W is disposed. The first plasma mechanism 30 is an example of a remote plasma that generates plasma of a reactive gas outside the processing chamber 11. The reactive gas supply 31 is connected to the external chamber 32 and supplies a reactive gas to the first chamber 30s. The reactive gas supply 31 includes a flow rate controller and an opening/closing valve, and supplies a reactive gas at a desired flow rate.

As the reactive gas, a gas containing no hydrogen atom is used. This can suppress residual hydrogen in the film formed on the substrate W. For example, the reactive gas may include at least one of $N_2$ gas, $N_2O$ gas, and $O_2$ gas. In the first embodiment, an example in which $N_2$ gas is used as the reactive gas will be described.

In the external chamber 32, a dielectric window 33 is provided to hermetically seal the interior of the first chamber 30s, and a radio frequency (RF) antenna 34 formed in a coil shape is disposed outside the dielectric window 33 and inside the external chamber 32. The RF antenna 34 preferably has a form of, for example, a spiral coil or a concentric coil having loops of constant radii, and is fixed to an outer wall of the dielectric window 33 by an antenna fixing member made of an insulator.

A high-frequency power supply 35 is electrically connected to one end of the RF antenna 34 via a matcher 36. The other end of the RF antenna 34 is electrically connected to the ground potential via a ground wire.

The high-frequency power supply 35 outputs a high-frequency power having a frequency suitable for plasma generation. The frequency of the high-frequency power supply 35 is preferably from 450 kHz to 40 MHz, and is, for example, from 2.3 MHz to 2.5 MHz. The matcher 36 performs matching between the impedance on the high-frequency power supply 35 side and the impedance on the load side, and functions so that the impedance on the high-frequency power supply 35 and the impedance on the load side apparently match when plasma is generated in the first chamber 30s.

For example, when $N_2$ gas is used as the reactive gas, the first plasma mechanism 30 requires energy greater than or equal to 12 eV to dissociate the $N_2$ gas. Therefore, the first plasma mechanism 30 generates inductively coupled plasma 30p having energy for dissociating the reactive gas. That is, the high-frequency electric field formed through the dielectric window 33 by the high-frequency power applied via the RF antenna 34 sufficiently dissociates and activates the $N_2$ gas in the first chamber 30s, thereby generating plasma (active species) of the $N_2$ gas. However, the first plasma mechanism 30 is not limited to forming the inductively coupled plasma. For example, the first plasma mechanism 30 may be a mechanism that generates microwave plasma having energy for dissociating the reactive gas.

A gas inlet 26 is formed at the center of the upper portion of the showerhead 21, and the gas inlet 26 is connected to the external chamber 32. The plasma of the $N_2$ gas activated in the first chamber 30s passes through a gas line 30a, the gas inlet 26, and the first gas supply path 22, and is supplied in a shower form from multiple first gas holes 22a to the second chamber 10s.

The second plasma mechanism 40 generates capacitively coupled plasma (CCP) 10p in the first chamber 30s inside the processing chamber 11. However, the second plasma mechanism 40 is not limited to generating the capacitively coupled plasma, and may generate inductively coupled plasma. The second plasma mechanism 40 activates the source gas. Additionally, the second plasma mechanism 40 reactivates the $N_2$ gas activated by the first plasma mechanism 30.

The source gas supply 51 supplies the source gas to the second chamber 10s. For example, the source gas may include at least one of silane ($SiH_4$) gas, disilane ($Si_2H_6$) gas, dichlorosilane ($H_2SiCl_2$) gas, and tetraethoxysilane (TEOS: $Si(OC_2H_5)_4$) gas. Here, also in the source gas, it is preferable that the proportion of hydrogen in the molecule is small. For example, disilane gas or dichlorosilane gas is preferable as the source gas because the proportion of hydrogen in the molecule is lower than that of silane gas. In the first embodiment, an example in which silane gas is used as the source gas will be described.

A gas inlet 27 is formed at an outer edge of the upper portion of the showerhead 21, and the gas inlet 27 is connected to the source gas supply 51 via a gas line 50a. The silane gas passes through the gas line 50a, the gas inlet 27, and the second gas supply path 23, and is supplied in a shower form to the second chamber 10s through multiple second gas holes 23a.

A high-frequency power supply (a first high-frequency power supply) 41 is electrically connected to the showerhead 21 via a matcher (a first matcher) 42. The high-frequency power supply 41 outputs a high-frequency power having a frequency suitable for plasma generation. The frequency of the high-frequency power supply 41 is preferably from 10 MHz to 40 MHz, and is, for example, 27.12 MHz. The matcher 42 performs matching between the impedance on the high-frequency power supply 41 side and the impedance on the load side, and functions so that the impedance on the high-frequency power supply 41 side and the impedance on the load side apparently match when plasma is generated in the second chamber 10s.

Specifically, the matcher 42 of the high-frequency power supply 41 includes a variable capacitor 421, a coil 422, and a variable capacitor 423. The variable capacitor 421, the coil 422, and the variable capacitor 423 are arranged in series. Additionally, the matcher 42 is provided with a high-frequency sensor (a first high-frequency sensor) 43 that detects a reflected wave from the load side. Based on the detection result of the high-frequency sensor 43, the controller 70 controls the variable capacitors 421 and 423 of the matcher 42 so that the impedances match.

In the second plasma mechanism 40, a high-frequency electric field is formed between the showerhead 21 and the stage 12 by high-frequency power being applied by the high-frequency power supply 41. The formed high-frequency electric field sufficiently dissociates and activates the silane gas in the second chamber 10s, thereby generating plasma of the silane gas.

While the plasma of the $N_2$ gas activated in the first chamber 30s is transferred from the first chamber 30s to the second chamber 10s, the dissociated N atoms, ions, and radicals are recombined or deactivated to weaken the activation state of the plasma. With respect to the above, the high-frequency electric field formed between the showerhead 21 and the stage 12 re-dissociates the $N_2$ gas recombined in the second chamber 10s, thereby reactivating the plasma of the $N_2$ gas.

Additionally, a high-frequency power supply (a second high-frequency power supply) 44 is electrically connected to the showerhead 21 via a matcher (a second matcher) 45. The high-frequency power supply 44 outputs high-frequency power for attracting ions to the stage 12. The frequency of the high-frequency power supply 44 is preferably from 300 kHz to 500 kHz, and is, for example, 400 kHz. The matcher 45 performs matching between the impedance on the high-frequency power supply 44 side and the impedance on the load side, and functions so that the impedance on the high-frequency power supply 44 and the impedance on the load apparently match when plasma is generated in the second chamber 10s.

Specifically, the matcher 45 of the high-frequency power supply 44 includes a variable capacitor 451, a coil 452, and a variable capacitor 453. The variable capacitor 451, the coil 452, and the variable capacitor 453 are arranged in series. Additionally, the matcher 45 is provided with a high-frequency sensor (a second high-frequency sensor) 46 that detects a reflected wave from the load side. Based on the detection result of the high-frequency sensor 46, the controller 70 controls the variable capacitors 451 and 453 of the matcher 45 so that the impedances match.

The film deposition apparatus 10 includes the controller 70 including, for example, a microcomputer. The controller 70 controls individual operations of the respective sections of the film deposition apparatus 10, such as the high-frequency power supply 35, the high-frequency power supply 41, the high-frequency power supply 44, the matcher 36, the matcher 42, the matcher 45, the first plasma mechanism 30, the second plasma mechanism 40, the reactive gas supply 31, the source gas supply 51, and the like, and an operation of the entire apparatus.

The controller 70 performs the following control during the film deposition. First, the controller 70 performs control to accommodate the substrate W in the second chamber 10s. Next, the controller 70 controls the reactive gas supply 31 and the first plasma mechanism 30 to activate the reactive gas containing no hydrogen atoms, and further controls the second plasma mechanism 40 to reactivate the reactive gas and supply the reactivated reactive gas to the substrate W.

Additionally, the controller 70 controls the source gas supply 51 and the second plasma mechanism 40 to activate the source gas and supply the activated source gas to the substrate. At this time, the controller 70 may simultaneously supply the source gas and the reactive gas to the substrate W. With this, the controller 70 causes the source gas and the reactive gas to react with each other to form a film on the substrate W. By such control, a nitride film of SiN can be formed on the substrate W by chemical vapor deposition (CVD). An oxide film of SiOx or an oxynitride film of SiON may be formed by changing the source gas and the reactive gas.

When $N_2$ gas is used as the reactive gas, the first plasma mechanism 30 includes the high-frequency power supply 35, the matcher 36, the RF antenna 34, and the dielectric window 33, and activates the $N_2$ gas in the first chamber 30s in the external chamber 32. When silane gas is used as the source gas, the second plasma mechanism 40 includes the high-frequency power supply 41 and the matcher 42, and activates the silane gas in the second chamber 10s in the processing chamber 11. Additionally, the second plasma mechanism 40 reactivates the $N_2$ gas whose activation is weakened in the course of being transferred from the first chamber 30s to the second chamber 10s.

$N_2$ gas can be dissociated with an energy greater than about 10 eV. When silane gas is used as the source gas, silane gas can be dissociated by an energy greater than about 4 eV.

The electron temperature of the inductively coupled plasma of the first embodiment is about 12 eV or greater. Thus, the first plasma mechanism 30 can dissociate the $N_2$ gas by collision between electrons of the inductively coupled plasma and the $N_2$ gas by generating the inductively coupled plasma. This generates plasma of the $N_2$ gas activated in the first chamber 30s.

With respect to the above, the electron temperature of the capacitively coupled plasma of the first embodiment is in a range of about 7 eV to 8 eV. Thus, the second plasma mechanism 40 can dissociate the silane gas by collision between electrons of the capacitively coupled plasma and the silane gas by generating the capacitively coupled plasma. This generates plasma of the silane gas activated in the second chamber 10s.

That is, in the first embodiment, the $N_2$ gas is first supplied to the first chamber 30s, activated in the first chamber 30s by the first plasma mechanism 30 using the inductively coupled plasma, and transferred to the second chamber 10s. With respect to the above, the silane gas is directly supplied to the second chamber 10s, and is activated in the second chamber 10s by the second plasma mechanism 40 using the capacitively coupled plasma.

Because the first chamber 30s is provided outside the processing chamber 11, the plasma of the activated $N_2$ gas is partially deactivated or molecules are recombined in the course of being transferred to the second chamber 10s.

Then, the second plasma mechanism 40 re-dissociates the plasma of the $N_2$ gas whose activation is weakened and the recombined $N_2$ molecules in the second chamber 10s. Because the $N_2$ gas is once dissociated in the first chamber 30s, it is conceivable that the N atom and the like are in a state in which an energy level is high and atoms are easily dissociated. Therefore, an energy required to re-dissociate the plasma of the $N_2$ gas weakened when being transferred to the second chamber 10s and the recombined $N_2$ molecules may be lower than an energy required to dissociate the $N_2$ gas in the first chamber 30s. That is, even in the capacitively coupled plasma having a lower electron temperature and lower energy than the inductively coupled plasma, the plasma of the $N_2$ gas whose activation is weakened and the recombined $N_2$ molecules can be sufficiently dissociated.

Therefore, in the first embodiment, the $N_2$ gas is dissociated in two stages. In the first stage, the $N_2$ gas is dissociated by the energy of the inductively coupled plasma in the first chamber 30s, and in the second stage, the $N_2$ gas is re-dissociated by the energy of the capacitively coupled plasma in the second chamber 10s. Here, in the second stage, the $N_2$ gas may be re-dissociated by the energy of the inductively coupled plasma in the second chamber 10s. However, in the second stage, when capacitively coupled plasma, which has a lower energy than inductively coupled plasma, is used, the uniformity of the film thickness becomes better, and the film quality can be easily controlled.

When the $N_2$ gas and the silane gas pass through the same gas path in the showerhead 21, N ions or N radicals react with the silane gas and are consumed in the course of being transferred. It is preferable that these gases are supplied to the second chamber 10s while maintaining an activated state. It is preferable that these gases are consumed as little as possible before these gases are transferred to the second chamber 10s. Therefore, in the first embodiment, the first gas supply path 22 and the second gas supply path 23 in the showerhead 21 are gas paths of different systems. This allows the activated $N_2$ gas and silane not to be easily consumed before being supplied to the second chamber 10s.

Figure 2:
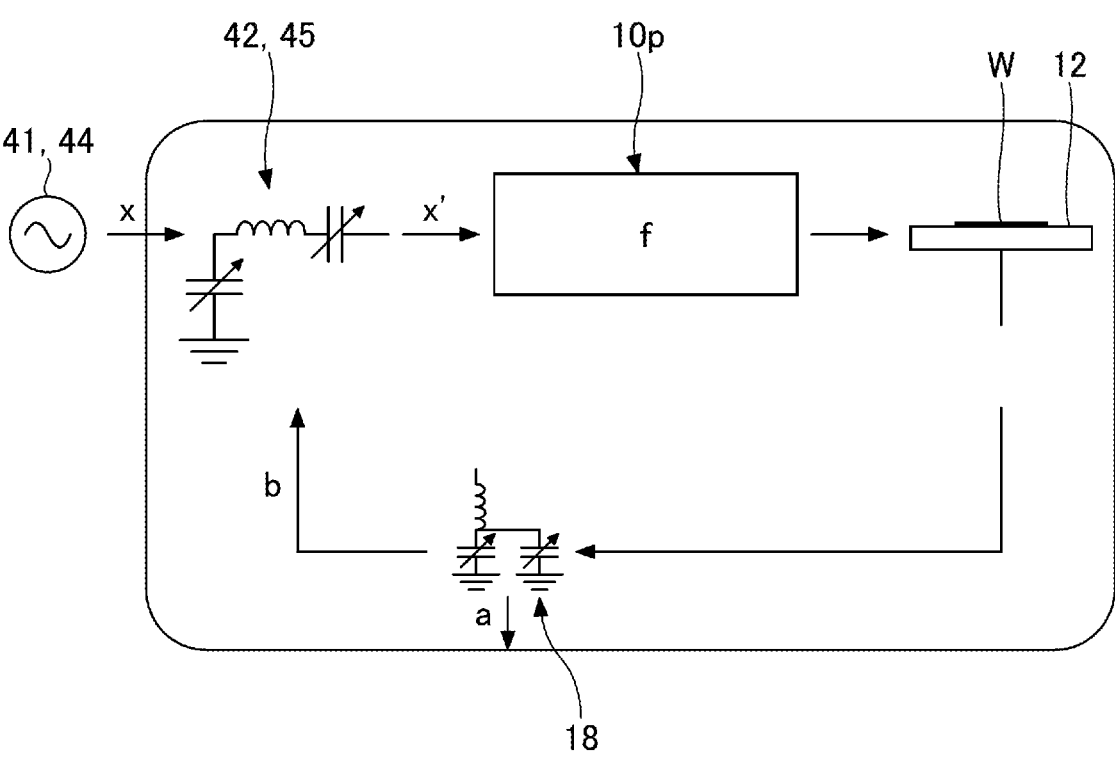
FIG. 2 is a schematic diagram depicting control of capacitively coupled plasma generated in a second chamber.

FIG. 2 is a schematic diagram depicting the control of the capacitively coupled plasma 10p generated in the second chamber.

When the high-frequency power is applied from the high-frequency power supplies 41 and 44 to the upper electrode (the showerhead 21), the matchers 42 and 45 perform impedance matching with respect to a process atmosphere in the second chamber 10s (the state of the capacitively coupled plasma 10p). That is, the controller 70 controls the variable capacitors 421 and 423 (see FIG. 1) of the matcher 42 based on the detection result of the high-frequency sensor 43 so that the output impedance of the high-frequency power supply 41 and the load impedance of the capacitively coupled plasma 10p apparently match. Additionally, the controller 70 controls the variable capacitors 451 and 453 (see FIG. 1) of the matcher 45 based on the detection result of the high-frequency sensor 46 so that the output impedance of the high-frequency power supply 44 and the load impedance of the capacitively coupled plasma 10p apparently match.

Additionally, the lower electrode (the electrode 15 of the stage 12) is grounded via the matcher 18. Here, the controller 70 controls the variable capacitors 182 and 183 of the matcher 18 based on the detection result of the high-frequency sensor 19. Specifically, the controller 70 controls the self-bias voltage (Vdc) of the electrode 15 by controlling the variable capacitors 182 and 183. By controlling the self-bias voltage (Vdc), the height position of the capacitively coupled plasma 10p generated between the upper electrode (the showerhead 21) and the lower electrode (the electrode 15 of the stage 12) of the second chamber 10s is controlled.

That is, as illustrated in FIG. 2, an RF input that is input from the high-frequency power supplies 41 and 44 is represented by x. An RF output matched by the matchers 42 and 45 is represented by x'. The process atmosphere in the second chamber 10s (the state of the capacitively coupled plasma 10p) is represented by a function f(x).

Additionally, an output controlled by the matcher 18 is represented by a. Here, the output a is the height position of the capacitively coupled plasma 10p.

Additionally, by controlling the variable capacitors 182 and 183 of the matcher 18, the process atmosphere in the second chamber 10s is changed. When the process atmosphere in the second chamber 10s is changed, the controller 70 performs impedance matching of the matchers 42 and 45 again in accordance with the changed process atmosphere.

In other words, the control of the matcher 18 is fed back to the matchers 42 and 45 via the process atmosphere in the second chamber 10s.

As described above, according to the film deposition apparatus of the first embodiment, the capacitively coupled plasma 10p can be controlled by controlling the matchers 42 and 45, which are on the input side for the process atmosphere, and the matcher 18, which is on the output side for the process atmosphere. In other words, the film deposition apparatus according to the first embodiment can control the capacitively coupled plasma 10p by configuring the feedback loop as illustrated in FIG. 2 for the process atmosphere, which cannot be calculated.

This can control the height position of the capacitively coupled plasma 10p generated between the upper electrode (the showerhead 21) and the lower electrode (the electrode 15 of the stage 12) of the second chamber 10s.

Additionally, two high-frequency powers having different frequencies are supplied to the upper electrode (the showerhead 21) from the high-frequency power supply 41 and the high-frequency power supply 44. With respect to the above, the matcher 18 includes the variable capacitors 182 and 183 in parallel, the coil 181 and the variable capacitor 182 form a first LC series circuit, and the coil 181 and the variable capacitor 183 form a second LC series circuit. With this configuration, the impedance can be controlled corresponding to each of the high-frequency powers having two frequencies.

Second Embodiment

Figure 3:
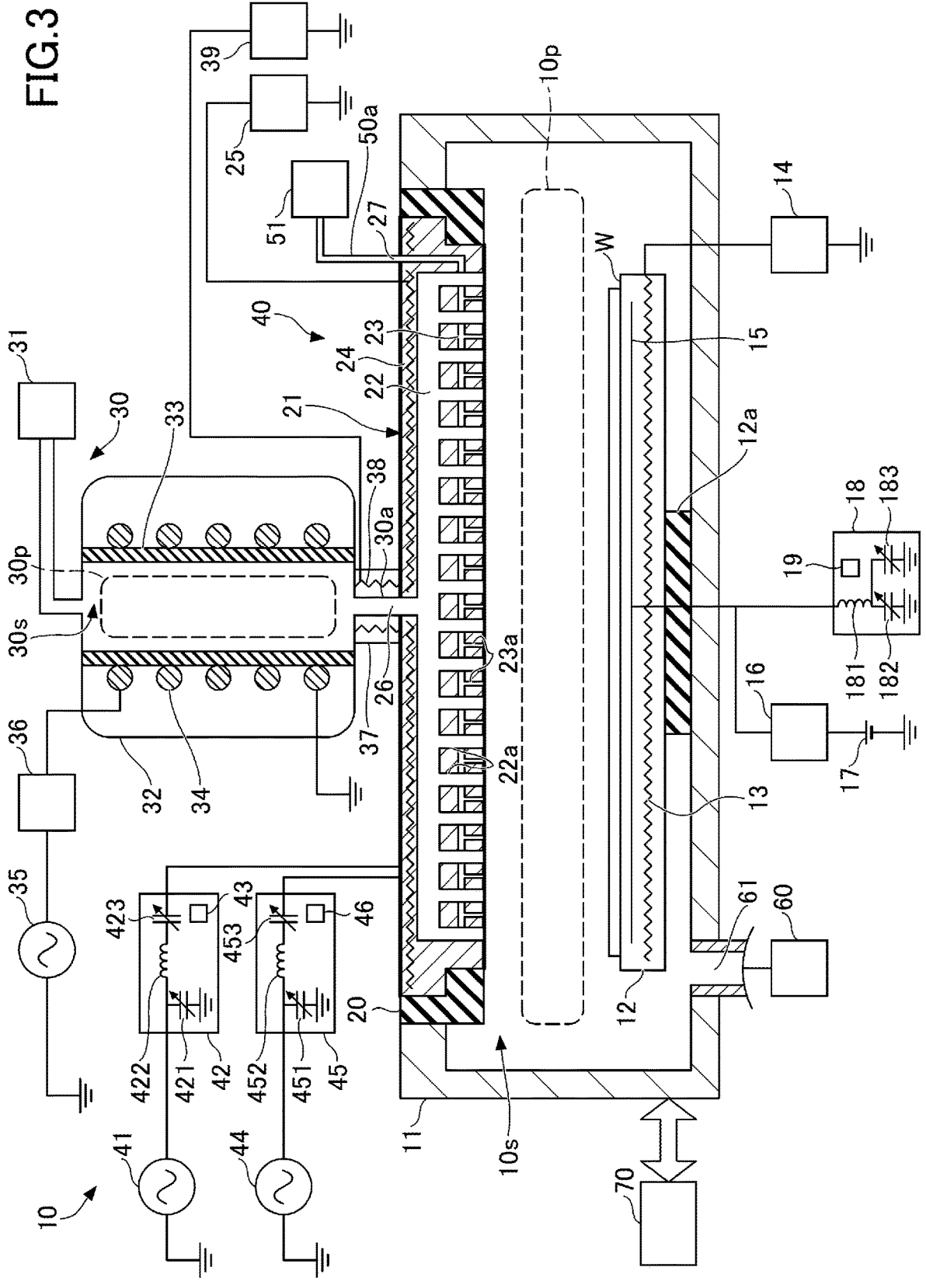
FIG. 3 is a schematic cross-sectional view illustrating a film deposition apparatus according to a second embodiment.

Next, a film deposition apparatus 10 according to a second embodiment will be described with reference to FIG. 3. FIG. 3 is a schematic cross-sectional view illustrating the film deposition apparatus 10 according to the second embodiment. The film deposition apparatus 10 according to the second embodiment is different from the film deposition apparatus 10 according to the first embodiment in that a heater block 37 is provided in the gas line 30a. The other configurations are substantially the same, and duplicated description will be omitted.

The heater block 37 is disposed to cover the gas line 30a connecting the external chamber 32 to the showerhead 21. A heater (a first heater) 38 made of high-melting-point metal such as molybdenum is embedded in the heater block 37. The heater 38 heats the heater block 37 to a predetermined temperature (for example, about 120° C.) by being supplied with power from the heater power supply 39, and heats the gas flowing through the gas line 30a passing through the heater block 37.

Figure 4A:
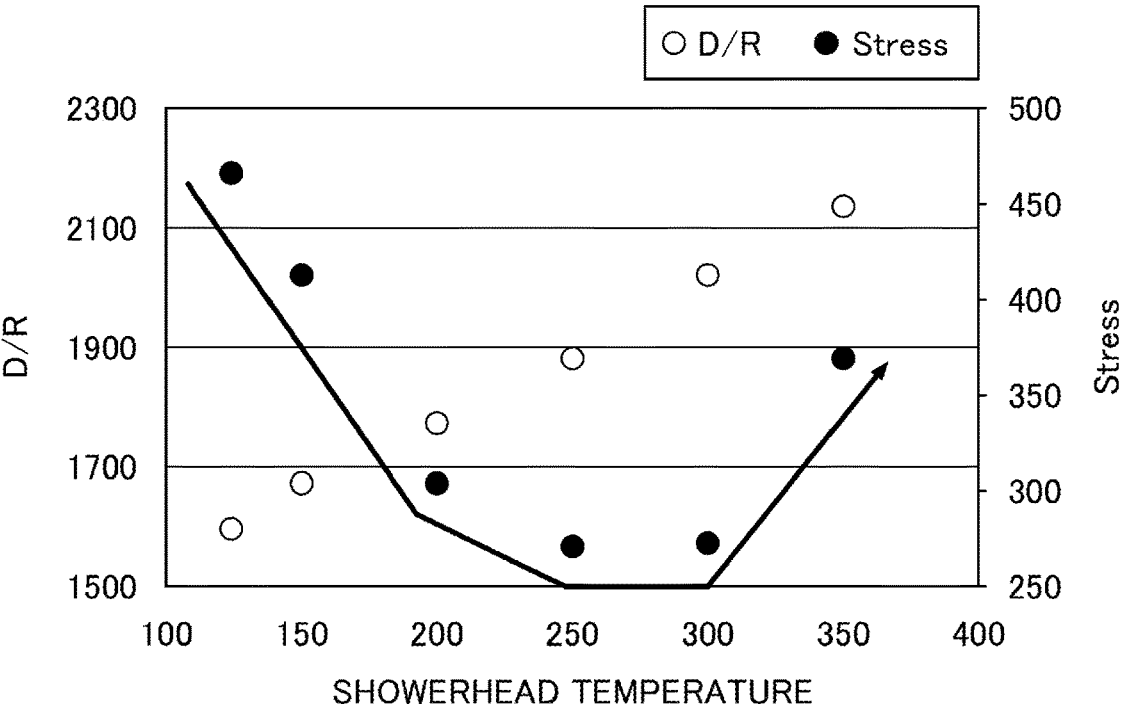
FIG. 4A and FIG. 4B are examples of a graph indicating a relationship between the temperature of the showerhead; and the film thickness and film stress of the film deposited on the substrate.
Figure 4B:
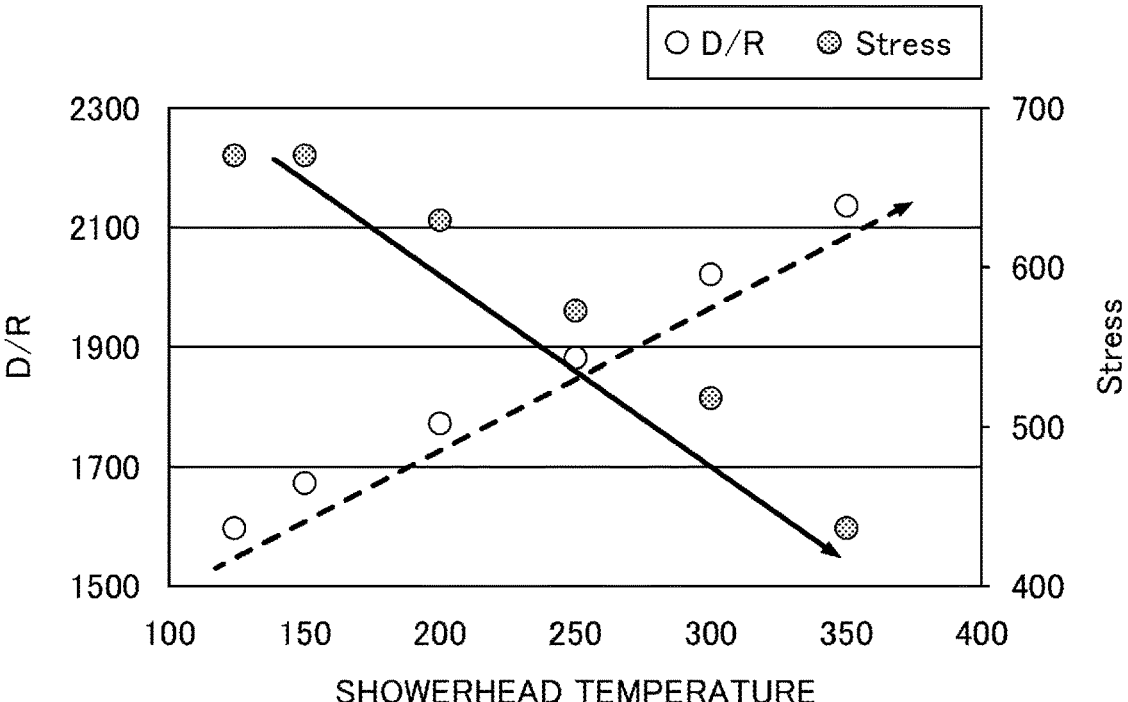

FIG. 4A and FIG. 4B are examples of a graph indicating a relationship between the temperature of the showerhead 21; and the film deposition rate (D/R) and the film stress (Stress) of the film formed on the substrate W. FIG. 4A indicates a result when the temperature of the heater block 37 is controlled to be 120° C. in the film deposition apparatus 10 according to the second embodiment. FIG. 4B indicates a result in a film deposition apparatus according to a reference example. Here, the film deposition apparatus according to the reference example is different from the film deposition apparatus 10 according to the second embodiment in that the heater block 37 is not provided. The other configurations are substantially the same, and duplicated description will be omitted.

Here, as indicated in FIG. 4B, in the film deposition apparatus according to the reference example, as the temperature of the showerhead 21 increases, the film deposition rate of the film formed on the substrate W increases (see the dashed arrow). Additionally, as the temperature of the showerhead 21 increases, the film stress of the film formed on the substrate W decreases (see the solid arrow).

With respect to the above, as indicated in FIG. 4A, in the film deposition apparatus 10 according to the second embodiment, as the temperature of the showerhead 21 increases, the film deposition rate of the film formed on the substrate W increases. Additionally, the film stress can be reduced by heating the gas with the heater block 37. Specifically, the film stress can be reduced when the temperature of the showerhead 21 is in a range of 150° C. to 350° C. This can suppress occurrence of warpage in the substrate W, for example.

It should be considered that the film deposition apparatuses according to the embodiments disclosed herein are illustrative in all respects and are not restrictive. The embodiments described above can be modified and improved in various forms without departing from the scope and spirit of the appended claims. The matters described in the multiple embodiments can also take other configurations as long as there is no contradiction, and can be combined as long as there is no contradiction.

According to one aspect, a film deposition apparatus that controls plasma can be provided.

What is claimed is:
1. A film deposition apparatus comprising:
a reactive gas supply configured to supply a reactive gas to a first chamber;
a source gas supply configured to supply a source gas to a second chamber;
a first plasma mechanism configured to generate inductively coupled plasma for activating the reactive gas;
a second plasma mechanism configured to generate capacitively coupled plasma for activating the reactive gas activated by the first plasma mechanism and the source gas; and
a controller,
wherein the second plasma mechanism includes:
an upper electrode;
a lower electrode opposite to the upper electrode;
a first high-frequency power supply configured to apply a high-frequency power to the upper electrode via a first matcher;

a second high-frequency power supply configured to apply a high-frequency power to the upper electrode via a second matcher; and
a third matcher connected to the lower electrode, wherein the third matcher includes at least one variable capacitor of the third matcher.
2. The film deposition apparatus according to claim 1, wherein the at least one variable capacitor of the third matcher includes:
a first variable capacitor and a second variable capacitor arranged in parallel; and
a coil arranged in series with respect to the first variable capacitor and the second variable capacitor.
3. The film deposition apparatus according to claim 1,
wherein the first matcher includes a first high-frequency sensor,
wherein the controller controls a variable capacitor of the first matcher based on a detection result of the first high-frequency sensor,
wherein the second matcher includes a second high-frequency sensor; and
wherein the controller controls a variable capacitor of the second matcher based on a detection result of the second high-frequency sensor.
4. The film deposition apparatus according to claim 3,
wherein the third matcher includes a third high-frequency sensor, and
wherein the controller controls the at least one variable capacitor of the third matcher based on a detection result of the third high-frequency sensor.
5. The film deposition apparatus according to claim 4,
wherein the controller controls the variable capacitor of the first matcher again based on a detection result of the first high-frequency sensor and controls the variable capacitor of the second matcher again based on a detection result of the second high-frequency sensor, after a state of the capacitively coupled plasma in the second plasma mechanism is changed by controlling the at least one variable capacitor of the third matcher.
6. The film deposition apparatus according to claim 1, further comprising:
a first heater provided in a gas flow path connected from the first plasma mechanism to a showerhead of the second plasma mechanism; and
a second heater provided in the showerhead.

\* \* \* \* \*